US00RE36706E

United States Patent [19]

Cole

[11] E Patent Number: Re. 36,706

[45] **Reissued Date of Patent: *May 23, 2000**

[54] MICROSTRUCTURE DESIGN FOR HIGH IR SENSITIVITY

[75] Inventor: Barrett E. Cole, Bloomington, Minn.

[73] Assignee: Honeywell Inc., Minneapolis, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/601,411

[22] Filed: Feb. 14, 1996

Related U.S. Patent Documents

Reissue of:

[64] Patent No.: 5,286,976
Issued: Feb. 15, 1994
Appl. No.: 07/288,701
Filed: Nov. 7, 1988

[51] Int. Cl.[7] ..... G01J 5/20; G01J 5/22; G01J 5/02

[52] U.S. Cl. ..... 250/349; 250/338.1; 250/338.4; 250/342

[58] Field of Search ..... 250/338.1, 338.4, 250/330, 332, 349, 370.01, 370.08

[56] References Cited

U.S. PATENT DOCUMENTS

| | | |
|---|---|---|
| 3,484,611 | 12/1969 | Futaki . |
| 3,619,614 | 11/1971 | Yamaka . |
| 3,629,585 | 12/1971 | Desvignes et al. . |
| 3,693,011 | 9/1972 | DeVaux et al. . |
| 3,851,174 | 11/1974 | Tynan et al. . |
| 3,896,309 | 7/1975 | Halsor et al. . |
| 4,009,516 | 3/1977 | Chiang et al. . |

(List continued on next page.)

FOREIGN PATENT DOCUMENTS

| | | |
|---|---|---|
| 2253214 | 5/1974 | Germany . |
| 58-131525 | 8/1983 | Japan . |
| 60-119426 | 6/1985 | Japan . |
| 61-170626 | 8/1986 | Japan . |
| 61-195318 | 8/1986 | Japan . |
| 1-136035 | 5/1989 | Japan . |
| 3-41305 | 2/1991 | Japan . |
| 91/16607 | 8/1986 | WIPO . |

OTHER PUBLICATIONS

Kurt Peterson & Anne Shartel, Micromechanical Accelerometer Integrated with MOS Detection Circuitry, IBM Research Facility, 1980, pp. 673–675.

H. Elabd & W.F. Kosonocky, Theory and Measurements of Photoresponse for Thin Film $Pd_2Si$ and PtSi Infrared Schottky–Barrier Detectors with Optical Cavity, 43 RCA Review, 569–588, 1982, K.C. Liddiard, Thin Film Resistance Bolometer IR Detectors, Infrared Phys., vol. 24, No. 1, 57–64, 1984.

W.F. Kosonosky, et al., 160×244 Element PtSi Schottky–Barrier IR–CCD Image Sensor, vol. Ed–32, No. 8, IEEE Transactions on Electron Devices, 1564–1573, Aug., 1985.

K.C. Liddiard, Thin–Film Resistance Bolometer IR Detectors—II, Infrared Phys., vol. 26, No. 1, 43–49, 1986.

Suzuki, et al, An Infrared Detector Using Poly–Silicon p–n Junction Diode, Tech Digest of 9th Sensor Symposium, 71, 72, and 74, 1990.

A. Tanaka, et al., Infrared Linear Image Sensor using a Poly–Si pn Junction Diode Array, 33 Infrared Phys., 229–231, and 234–236, 1992.

Thin–Film Resistance Bolometer IR Detectors, K.C. Liddiard, Infrared Phys., vol. 24, No. 1, pp. 57–64, 1984.

Thin–Film Resistance Bolometer IR Detectors II, K.C. Liddiard, Infrared Phys., vol. 26, No. 1, pp. 43–49, 1986.

*Primary Examiner*—Constantine Hannaher
*Attorney, Agent, or Firm*—Ian D. Mackinnon; Roger W. Jensen

[57] ABSTRACT

A microstructure design for high IR sensitivity having a two level infrared bolometer microstructure, the lower level having a reflective metal film surface such as Pt, Au, or Al to reflect IR penetrating to that level, the upper level being separated from the lower level by an air gap of about 1–2 microns which allows the reflected IR to interfere with the incident IR and increase the sensitivity to a higher level.

28 Claims, 5 Drawing Sheets

U.S. PATENT DOCUMENTS

| | | | |
|---|---|---|---|
| 4,029,962 | 6/1977 | Chapman . | |
| 4,067,104 | 1/1978 | Tracy . | |
| 4,115,692 | 9/1978 | Belcerak et al. . | |
| 4,169,273 | 9/1979 | Hendrickson . | |
| 4,239,312 | 12/1980 | Myer et al. . | |
| 4,286,278 | 8/1981 | Lorenze et al. . | |
| 4,317,126 | 2/1982 | Gragg . | |
| 4,354,109 | 10/1982 | Gelpey et al. . | |
| 4,365,106 | 12/1982 | Pulvari . | |
| 4,378,489 | 3/1983 | Chabinsky et al. . | |
| 4,463,493 | 8/1984 | Momose . | |
| 4,472,239 | 9/1984 | Johnson et al. . | |
| 4,691,104 | 9/1987 | Murata et al. . | |
| 4,750,834 | 6/1988 | Fately . | |
| 4,803,360 | 2/1989 | Ball et al. . | |
| 5,010,251 | 4/1991 | Grinberg et al. | 250/338.1 X |
| 5,017,784 | 5/1991 | Sher et al. . | |
| 5,021,663 | 6/1991 | Hornbeck | 250/338.1 X |
| 5,455,421 | 10/1995 | Spears . | |

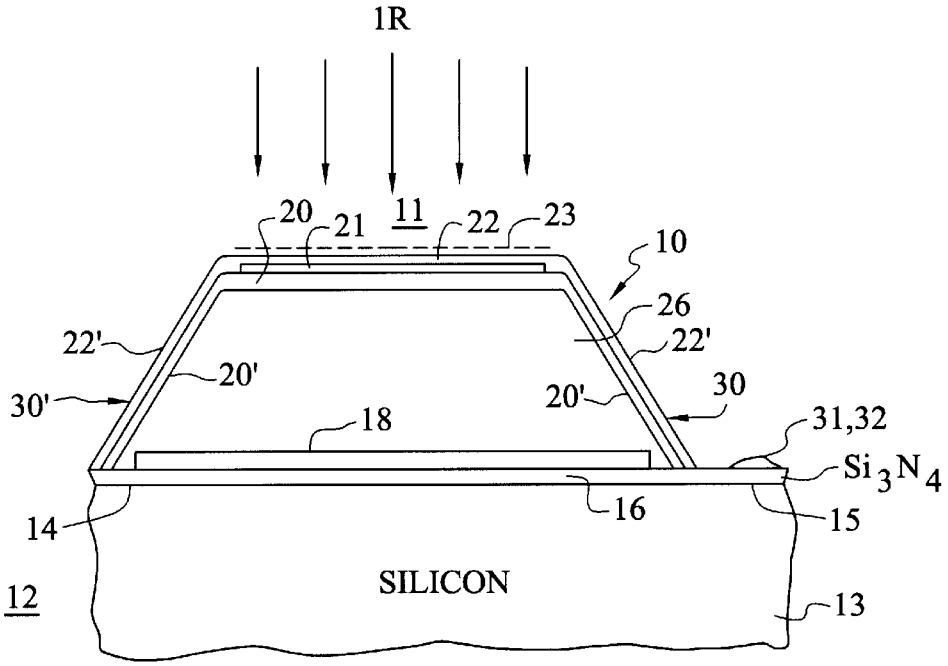
*Fig. 1* AMENDED
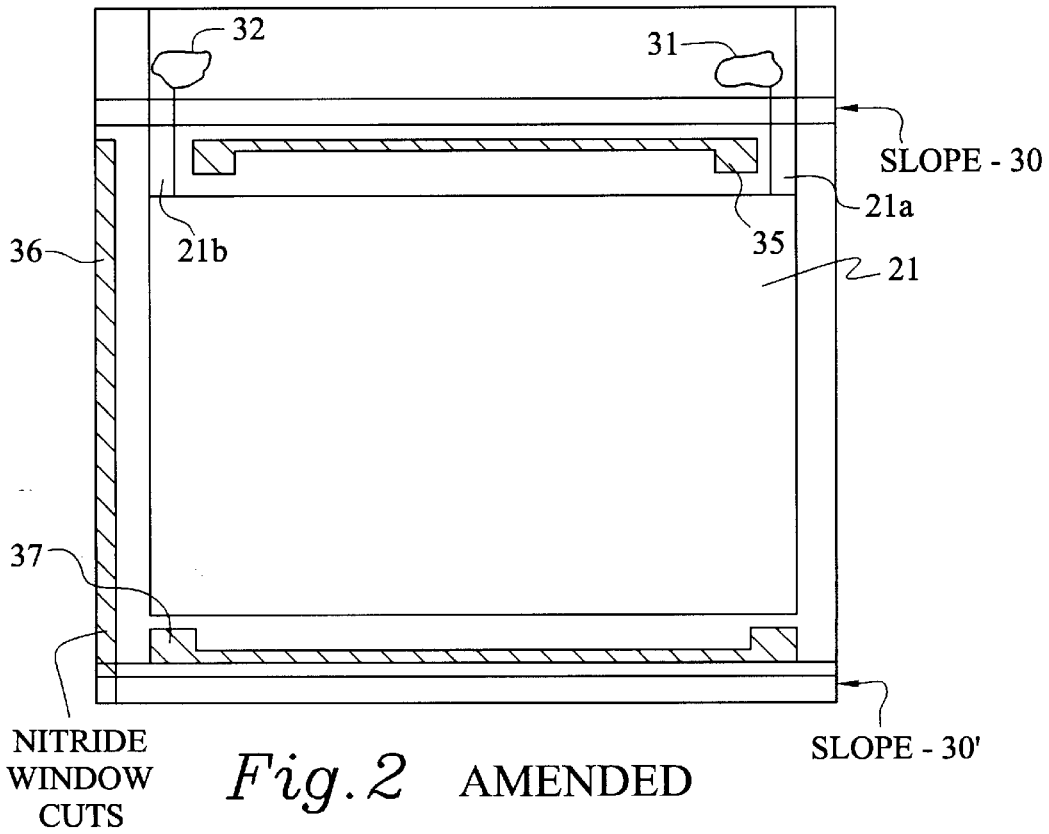
*Fig. 2* AMENDED

MICROSTRUCTURE DESIGN FOR HIGH IR SENSITIVITY

Matter enclosed in heavy brackets [ ] appears in the original patent but forms no part of this reissue specification; matter printed in italics indicates the additions made by reissue.

FIELD OF THE INVENTION

The field of the invention is in a high sensitivity two-level microstructure infrared bolometer array which can produce absorptance levels of greater than 80% and also achieve high IR sensitivity over a wavelength range from 8–14 microns.

BACKGROUND AND SUMMARY OF THE INVENTION

This invention is an improvement on co-pending application Ser. No. 887,495, filed Jul. 16, 1986, entitled "Thermal Sensor", and assigned to the same assignee as the present invention. The teachings of the co-pending application are incorporated herein by reference. In the co-pending application the invention is directed to a pixel size sensor of an array of sensors, for an infrared microbridge construction of high fill factor, made possible by placing the detector microbridge on a second plane above the silicon surface carrying the integrated components and bus lines. The improvement in the present invention is directed to a structure which increases the sensitivity.

BRIEF DESCRIPTION OF THE DRAWINGS

FIGS. 1 and 2 are front and top views of a microstructure design according to the invention.

DESCRIPTION

Figure 3:
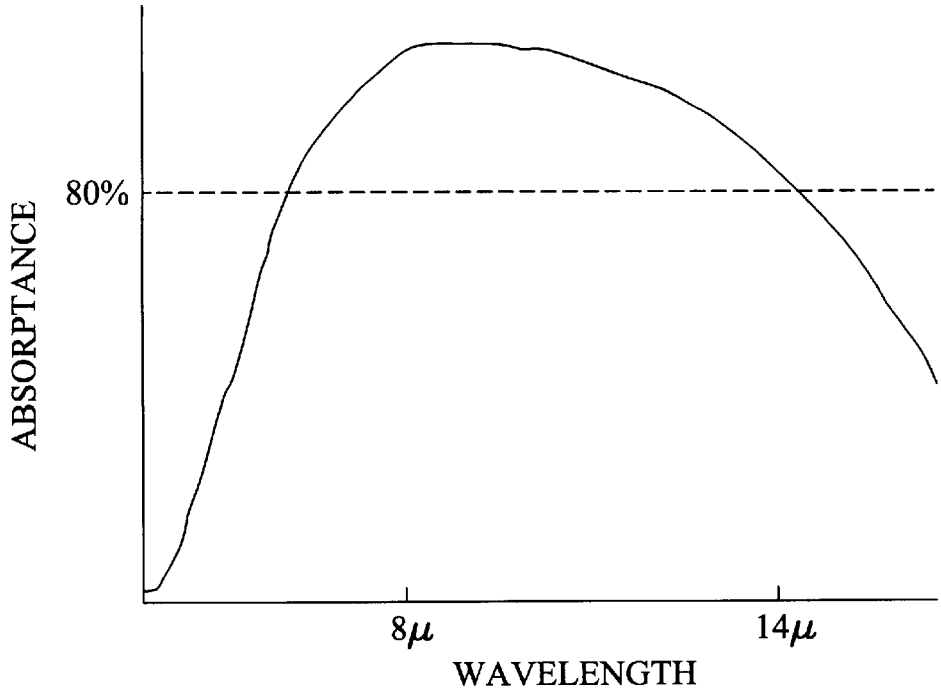
FIG. 3 is a graphical plot of overall absorptance vs. wavelength of the device over a selected wavelength including 8–14 microns.

A cross section view of the two-level microbridge bolometer pixel 10 is shown in FIG. 1. The device 10 has two levels, an elevated microbridge detector level 11 and a lower level 12. The lower level has a flat surfaced semiconductor substrate 13, such as a single crystal silicon substrate. The surface 14 of the substrate has fabricated thereon conventional components of an integrated circuit 15 such as diodes, bus lines, connections and contact pads (not specifically shown), the fabrication following conventional silicon IC technology. The IC is coated with a protective layer of silicon nitride 16.

The elevated detector level 11 includes a silicon nitride layer 20, a thin film resistive layer 21, preferably a vanadium or titanium oxide (such as $V_2O_3$, $TiO_x$, $VO_x$), [i.e.] *sometimes hereinafter referred to as* $AB_x$ a silicon nitride layer 22 over the layers 20 and 21 and an IR absorber coating 23 over the silicon nitride layer 22. The thin absorber coating (approximately 20A thick) may be of a nickel iron alloy, often called permalloy. Downwardly extending silicon nitride layers 20' and 22' deposited at the same time as layers 20 and 22 during the fabrication make up the sloping supports 30 *and 30'* for the elevated detector level. The cavity or gap 26 (approximately 1–2 microns high) between the two levels is ambient atmosphere. During the fabrication process, however, the cavity 26 was originally filled with a previously deposited layer of easily dissolvable glass or other dissolvable material until the layers 20, 20', 22 and 22' were deposited. Some other easily dissolvable materials are quartz, polyimide and resist. Subsequently in the process the glass was dissolved out to provide the thermal isolation cavity or air gap (i.e., the air gap actually may be in operation, a vacuum gap). In FIG. 1 the horizontal dimension, as shown, is greatly foreshortened. That is, the height of FIG. 1 is exaggerated in the drawing compared to the length in order to show the details of the invention.

FIG. 2 is a top plan view of the elevated detector level 11. This drawing is made as though the overlying absorber coating 23 and the upper silicon nitride layer 22 are transparent so that the resistive thin film layer 21 can be shown. In one preferred embodiment the material for the resistive layer 21 is a vanadium oxide, preferably $V_2O_3$. Vanadium oxides have very strong changes in resistance with temperature allowing high sensitivity microbolometer operation. It also has a low reflectance to IR in the 8–14 micron range. In the preferred embodiment at this time, the $V_2O_3$ is operated in its semiconductor phase. Its deposition is preferably by the process of ion beam sputter which permits the deposition of very thin layers such as 50–75 [mm] *nm*. This material was thus selected for its low IR reflectance together with a relatively high temperature coefficient of resistance (TCR). The ends of the resistive paths 21a and 21b are continued down the slope area 30 embedded in 20' and 22' to make electrical contact with contact pads 31 and 32 on the lower level.

FIG. 2 also shows nitride window cuts 35, 36 and 37 which are opened through the silicon nitride layers 20 and 22 to provide access to the phos-glass beneath for dissolving it from beneath the detector plane. The sloping supports may be of the necessary length is provide adequate support and thermal isolation for the upper level 11.

Although the description is basically in terms of individual detector pixels, the invention is directed for use to an x,y array assembly of adjoining pixels forming an imaging or mosaic detector array. Each pixel assembly may cover an area about 50 microns on a side, as an example.

Referring again to FIG. 1 a sequence of fabrication steps for the upper level is described. Following the deposition of the silicon nitride layer 16 in fabricating the lower level 12, a thin film layer 18 of reflective material, such as a metal film like Pt or Au, is deposited. The construction of the upper level can then commence. The detectors presently being described are intended for use in the 8–14 micron IR wavelength. The reflective layer 18 is on the lower plane 12. The vertical distance between reflective layer 18 and upper level 11 is chosen so the reflected IR from layer 18 returned upwardly has interference properties such that significant absorption is achieved for a wide range of wavelengths (8–14 microns) [and air gap spacing between the reflector and the detector structure].

A layer of phos-glass or other easily soluble material in the range of about 1–2 microns thick is deposited and the slopes 30 and 30' are thoroughly rounded to eliminate slope coverage problems. The upper level silicon nitride base layer 20 is then deposited, the resistive film 21 is deposited, connections down the slope to lower plane contact pads are made, and a silicon nitride passivation layer 22 covers the layers 21 and 20. A thin metal absorber coating 23 (about 15–40A) is deposited on top of the upper level. The slots 35, 36 and 37, earlier mentioned are made and the phos-glass is dissolved from beneath the detector plane. As earlier described, by depositing Pt, Au or other reflecting thin film 18 on the substrate before the stack is formed, it is possible to reflect transmitted radiation reaching the reflecting film back to the absorber coating.

The optical properties of the total structure are achieved by careful selection of optical materials with the proper optical and electrical properties. The top film must reflect little radiation and generally transmit a significant percentage of the non-absorbed radiation through to the reflected light at a nodal position in the film determined by the air gap distance. *Stated otherwise, the air gap distance is determined so that the reflected light is at a nodal position in the film.* An additional constraint on the absorbing film is that to be compatible with the total structure, the absorbing material must be very thin (and hence have a low mass).

Figure 4:
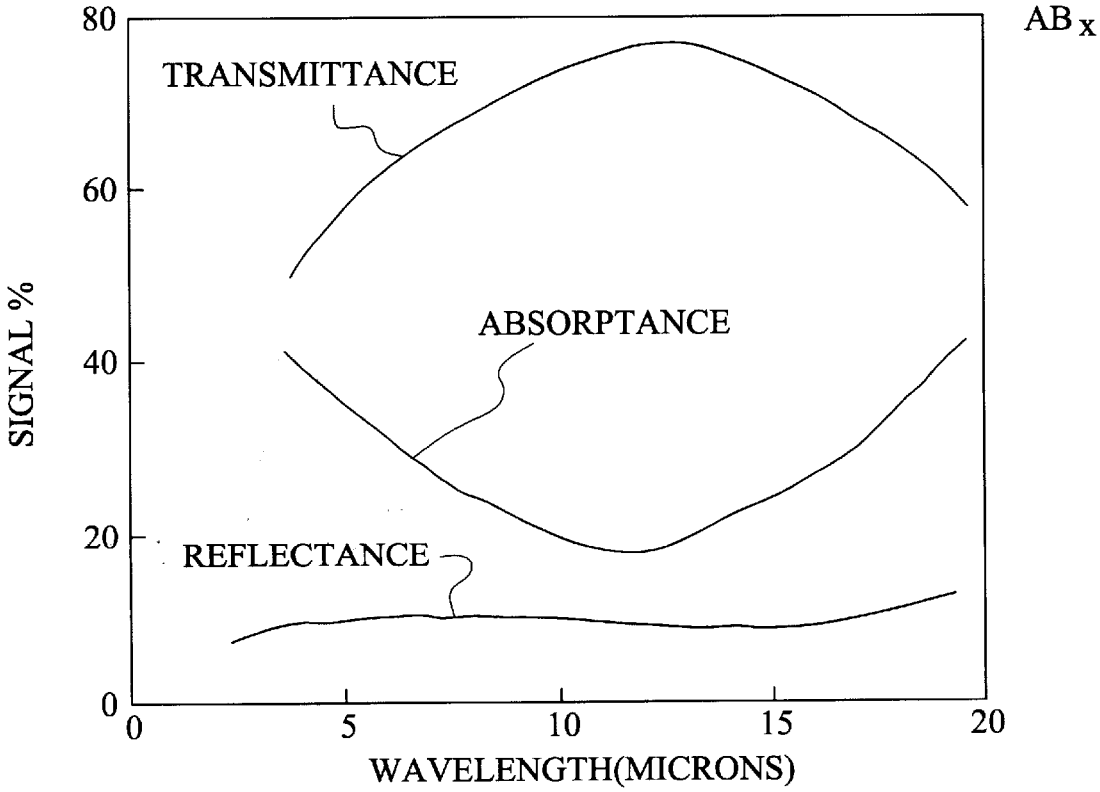
FIG. 4 shows graphically the transmittance, absorption and reflectance of the resistive layer.
Figure 6:
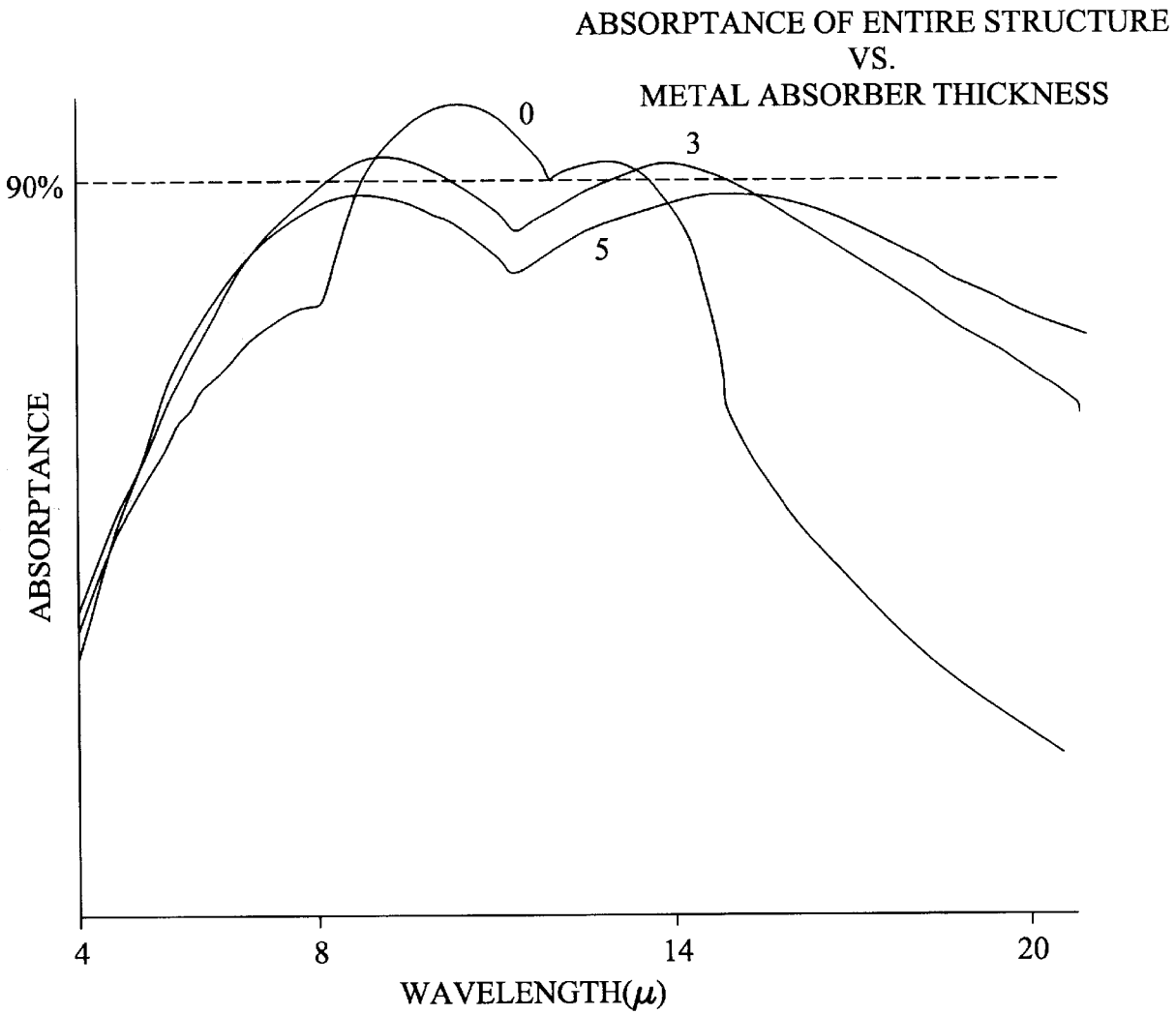
FIG. 6 shows absorption of entire structure vs. metal absorber thickness.
Figure 7:
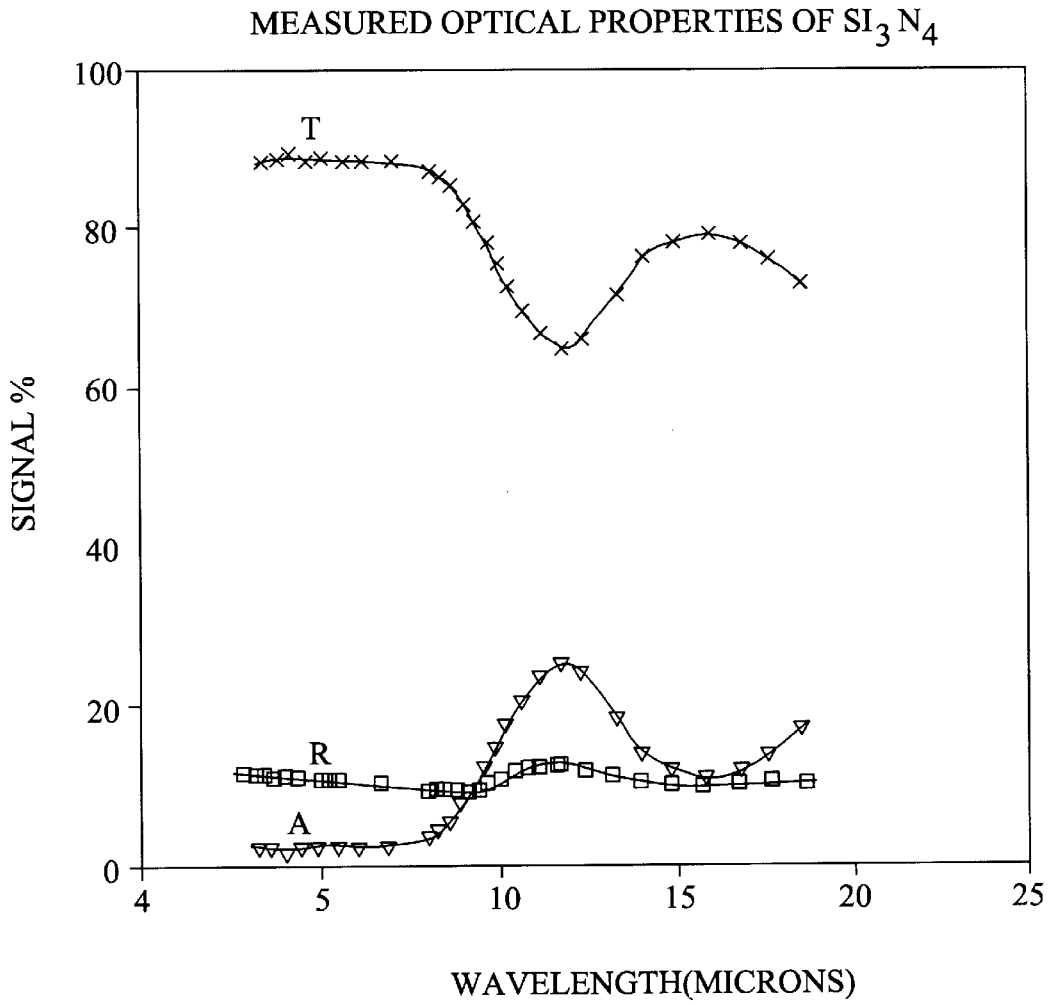
FIG. 7 shows measured optical properties of $Si_3N_4$.

To optimize the absorption in the structure, the thickness of all the absorbing layers and the air gap distance must be controlled. The absorbing films in the present device consist of [ABx] $AB_x$, [SIN] *SiN*, and the thin absorbing metal described above. In practice, the [ABx] $AB_x$ and [SIN nitride] *SiN* thicknesses are chosen by electrical and physical requirements. Both have absorption levels ranging from 10–20% in the spectral region of interest (FIGS. 4 and 7). A combination of these materials produces an absorption of no more than about 30% in the 8–14 micron region. This absorption level is very close to ideal, however, for use with a Pt reflective layer and an air gap which intensifies the field in the absorbing film, it is possible to achieve absorptances in excess of 80% (FIG. 5) in this configuration. The use of a thin absorbing metal which in the standard design provides 50% absorption, here is used to fine tune the absorption for maximum effect. FIG. 6 shows the small absorption improvements that can be achieved by using this metal film.

In this two-level structure, the low thermal mass structure 11 is separated from the [Pt/substrate] *Pt substrate* layer by an air gap. The interference properties of this reflected radiation are such that significant absorption is achieved [by] *for* a wide range of wavelengths [and air gap spacing between the Pt reflector and the detector structure].

For this optical interference to occur in the detector, it is necessary to avoid other films in the detector structure which reflect IR. The use of $AB_x$ which has both a high TCR and a low IR reflectance (FIG. 4) ideally meets these requirements. Thus the merging of this absorption phenomenon into a detector structure which has a detector material processing both a high TCR and low reflectance permits this interference effect to occur.

There is a substantial degree of variability of detector absorptance with air gap in the structure. Referring to the table below which shows wavelength in nanometers in the left column vs. air gap in microns across the top it can be seen that with an air gap of only 0.5 micron the detector absorptance varies widely with wavelength and it is not very high. With air gaps of 1–2 microns and especially at 1.5 microns the absorptance is relatively high across the desired wavelength spread.

TABLE 1

DETECTOR ABSORPTANCE

| | Air Gap (microns) | | | | |
|---|---|---|---|---|---|
| Wavelength (NM) | .5 | .75 | 1.0 | 1.5 | 2.0 |
| 8000 | .89 | .91 | .9 | .84 | .76 |
| 9000 | .84 | .88 | .86 | .81 | |
| 10000 | .76 | .82 | .84 | .84 | .82 |
| 11000 | .69 | .77 | .8 | .82 | .82 |
| 12000 | .66 | .74 | .79 | .83 | .84 |
| 13000 | .64 | .78 | .85 | .93 | .94 |
| 14000 | .56 | .72 | .83 | .95 | .98 |
| 15000 | .47 | .64 | .77 | .92 | .99 |

Figure 5:
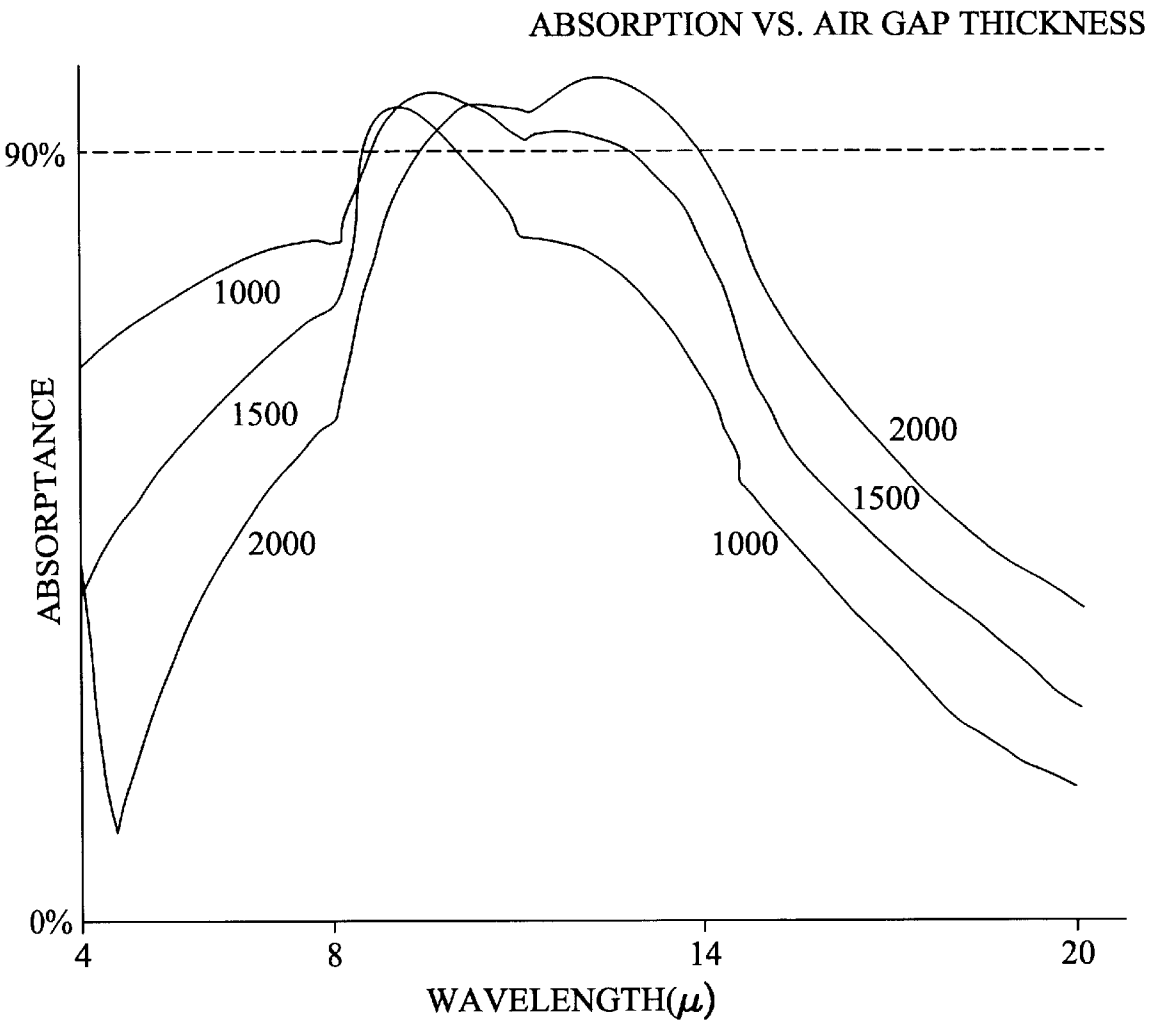
FIG. 5 shows graphically absorption vs. air gap thickness.

The effect of gap thickness on the absorptance vs. wavelength in the regions of interest are further displayed graphically in FIG. 5. It can be seen in the curve of 1.5 microns gap thickness that at 8 microns the absorptance of the structure is climbing rapidly towards 90% and more, and that it remains relatively high out to about 14 microns. The curve for a gap of 2 microns shows that at IR wavelengths of 14 microns the absorptance is better and well above 90%. In measuring the data for FIG. 5 the absorber film 23 was not included in the stack structure.

Referring now to FIG. 6 there is shown graphically how the overall absorption of the film structure varies across the IR wavelength of 8–14 microns as the thickness of the metal absorber film is increased to 3 [mm] *nm* and to 5 [mm] *nm*. In this film stack design the $Si_3N_4$ layer 22 is 250 [mm] *nm*, the resistive film 21 is 75 nm and the $Si_3N_4$ film 20 is 100 nm with an air gap of 1.5 microns and a reflective Pt layer 18 of 50 nm. This curve for 3 nm shows absorptance>90% between 8 and 14 microns.

The measured optical properties of reflectance R, transmissivity T, and absorptance A of the silicon nitride layers 20 and 22 (800A thick) are shown in FIG. 7 with percent of signal shown on the ordinate axis and IR wavelength along the abscissa. It can be seen that the transmissivity at 8 microns (about 90) and at 14 microns (about 80) is quite high and that the reflectance R at both 8 and 14 microns is well under ten.

The embodiments of the invention in which an exclusive property or right is claimed are defined as follows:

1. A two-level microbridge infrared bolometer structure comprising:

a bolometer structure on a semiconductor substrate, said structure having a lower section on the surface of the substrate and a microbridge upper detector plane structure spaced from and immediately above the lower section;

an infrared-reflective thin film metal coating on the surface of said lower section;

said upper microbridge detector plane structure comprising a planar sandwich structure including a *first* supporting dielectric thin film layer, and a thin film temperature responsive resistive element having first and second terminals;

downwardly extending dielectric leg portion means which are a downwardly extending continuation of said [upper structure] *first* dielectric *layer* supporting said upper microbridge detector plane structure above said lower section so that a thermal isolation gap exists between said upper [and] *detector plane structure and said* lower [sections] *section*; and, electrically conductive paths included in said downwardly extending leg portion means connecting said first and second terminals to said lower section.

2. The microbridge structure according to claim 1 wherein said reflective thin film metal coating is selected from the group consisting of Au, Pt, and Al.

3. The microbridge structure according to claim 1 wherein said dielectric is of silicon nitride.

4. The microbridge structure according to claim 1 wherein said thin film resistive element is selected from the group consisting of vanadium oxide and titanium oxide.

5. The microbridge structure according to claim 1 wherein said thin film resistive element is $V_2O_3$.

6. The microbridge structure according to claim 1 wherein said gap between said lower section and said upper detector *plane* structure is in the range of about 1–2 microns.

7. The microbridge structure according to claim 2 wherein the coating is about 50 nm in thickness.

8. The microbridge structure according to claim 1 and further comprising, in said planar sandwich structure, a second dielectric thin film layer and a thin film absorber layer.

9. The microbridge structure according to claim [3] *8* wherein the first *supporting* dielectric *thin film* layer [in] *is* on the order of 100 nm in thickness and the second dielectric *thin film* layer is on the order of 250 nm in thickness.

10. The microbridge structure according to claim 4 wherein the [resistive element film] *thin film resistive element* is on the order of 50–75 nm in thickness.

11. The microbridge structure according to claim 8 wherein the absorber layer is on the order of 30 nm in thickness.

12. A two-level microbridge infrared bolometer structure comprising:

a bolometer microstructure on a semiconductor substrate, said structure having a lower section on the surface of the substrate and a microbridge upper detector plane structure spaced from and immediately above the lower section;

an infrared reflective thin film metal coating on the surface of said lower section, said metal being selected from the group consisting of Au, Pt, and Al;

said upper microbridge detector plane structure comprising a planar sandwich structure including a first bridging dielectric thin film layer, a thin film temperature responsive resistive element selected from the group consisting of vanadium oxide and titanium oxide, said resistive element having first and second terminals, a second dielectric thin film layer over said first dielectric layer and resistive layer, and a thin film absorber layer;

downwardly extending dielectric leg portion means which are a downwardly extending continuation of said [upper structure] *first* dielectric *layer* supporting said upper microbridge detector plane structure above said lower section so that an air gap on the order of 1–2 microns exists between said upper [and] *detector plane structure and said* lower [sections] *section*; and, electrically conductive paths included in said downwardly extending leg portion means connecting said first and second terminals to said lower section.

*13. A two-level microbridge uncooled infrared thermal detector means comprising:*

*a pixel on a semiconductor substrate, said pixel having a lower section on the surface of said substrate and a microbridge upper detector section spaced from and immediately above the lower section;*

*said lower section including integrated circuit means and infrared-reflective means coating said integrated circuit means;*

*said microbridge upper detector section comprising a bridging dielectric layer having mounted thereon temperature responsive means having first and second terminals, said microbridge upper detector section being supported above said lower section by dielectric leg portions which are downward extending continuations of the bridging dielectric layer to thereby support said upper section and so that a thermal isolation gap is defined between said upper and lower sections;*

*and said first and second terminals being continued down said leg portions to said integrated circuit means; and*

*said two-level microbridge uncooled infrared thermal detector means being further characterized by the size of said gap, i.e., the distance between said upper and lower sections, being selected so that infrared radiation which initially passes through said upper section to said infrared-reflective means is then reflected toward and is intensified at said upper section to optimize infrared absorption over a preselected band of infrared wavelengths.*

*14. The thermal detector means of claim 13 wherein said bridging dielectric layer comprises a first dielectric layer beneath said temperature responsive means and a second dielectric layer over said first dielectric layer and said temperature responsive means.*

*15. The thermal detector means of claim 14 wherein said dielectric layers are of silicon nitride.*

*16. The thermal detector means according to claim 15 wherein the first dielectric layer is on the order of 100 nm in thickness and the second dielectric layer is on the order of 250 nm in thickness.*

*17. The two-level microbridge uncooled infrared thermal detector means of claim 13 wherein:*

*said temperature responsive means is a thin film resistive element;*

*said upper detector section includes absorber means covering said resistive element; and*

*said gap is selected so that infrared radiation reflected from said infrared-reflective means is intensified at said absorber means, to thereby optimize the absorption of infrared radiation in said upper detector section.*

*18. The thermal detector means according to claim 17 wherein the absorber means is a layer on the order of 30 nm in thickness.*

*19. The thermal detector means of claim 13 wherein said infrared-reflective means is a thin film metal coating.*

*20. The thermal detector means of claim 13 wherein said infrared-reflective means is a thin film metal coating selected from the group consisting of Au, Pt, and Al.*

*21. The thermal detector means according to claim 20 wherein the coating about 50 nm in thickness.*

*22. The thermal detector means of claim 13 wherein said temperature responsive means is a thin film resistive element.*

*23. The thermal detector means of claim 22 wherein said thin film resistive element is selected from the group consisting of vanadium oxide and titanium oxide.*

*24. The thermal detector means according to claim 23 wherein said thin film resistive element is on the order of 50–75 nm in thickness.*

*25. The thermal detector means of claim 22 wherein said thin film resistive element is $V_2O_3$.*

*26. The thermal detector means of claim 22 wherein said thin film resistive element is $V_2O_3$ operated in its semiconductor phase.*

*27. The thermal detector means according to claim 13 wherein said gap between said upper and lower sections is in the range of about 1–2 microns.*

*28. A two-level microbridge infrared bolometer structure comprising:*

*a bolometer structure on a semiconductor substrate, said structure having a lower section on the surface of the substrate and a microbridge upper detector plane structure spaced from and immediately above the lower section by a thermal isolation gap of between about 1–2 microns, the upper microbridge upper detector plane structure including a thin film resistive element having first and second terminals;*

*an infrared-reflective thin film on the surface of said lower section; and*

*electrically conductive paths connecting said first and second terminals to said lower section.*

* * * * *